United States Patent [19]

Mori et al.

[11] Patent Number: 5,053,845
[45] Date of Patent: Oct. 1, 1991

[54] THIN-FILM DEVICE

[75] Inventors: Koji Mori, Yokohama; Hideo Segawa, Tokyo; Masanori Itagaki, Kawasaki, all of Japan

[73] Assignee: Ricoh Company, Ltd., Tokyo, Japan

[21] Appl. No.: 483,335

[22] Filed: Feb. 20, 1990

Related U.S. Application Data

[63] Continuation of Ser. No. 265,909, May 21, 1981, abandoned.

[30] Foreign Application Priority Data

May 23, 1980 [JP] Japan .................................. 55-68570
May 23, 1980 [JP] Japan .................................. 55-68571

[51] Int. Cl.$^5$ ............................................. H01L 29/72
[52] U.S. Cl. .................................... 357/34; 357/30
[58] Field of Search ............... 357/4, 11, 30, 33, 34, 357/4, 23 TF, 30.4, 23.7, 30 B, 30 E, 30 L, 30 P, 59 C, 59 H

[56] References Cited

U.S. PATENT DOCUMENTS

| | | | |
|---|---|---|---|
| 3,483,038 | 12/1969 | Hui et al. | 357/71 X |
| 3,585,071 | 6/1971 | Koelmans | 357/4 X |
| 3,825,807 | 7/1974 | Wolf | 357/4 X |
| 3,838,439 | 9/1974 | Biard | 357/30 |
| 3,982,260 | 9/1976 | Wald | 357/4 X |
| 4,107,721 | 8/1978 | Miller | 357/30 |
| 4,127,424 | 11/1978 | Ullery | 357/4 |
| 4,197,552 | 4/1980 | Walker et al. | 357/4 X |
| 4,207,119 | 6/1980 | Tyan | 357/30 |
| 4,278,986 | 7/1981 | Mader | 357/33 |

OTHER PUBLICATIONS

Brodsky, M. H., Deneuville, A., *IBM Tech. Disclosure Bull.*, vol. 20, No. 9, pp. 3731-3734, Feb. 1978.
"Physics of Thin Films", Hass, G., Thun. R. D. (Ed.), vol. 2, Academic Press (1964), pp. 177-178.

*Primary Examiner*—Edward J. Wojciechowicz
*Assistant Examiner*—Sara W. Crane
*Attorney, Agent, or Firm*—Cooper & Dunham

[57] ABSTRACT

A thin-film device having the structure of a bipolar transistor is provided. The device has three thin-films formed one on another to form emitter, base and collector regions, thereby providing a NPN or PNP structure depending on the impurities contained in these thin-films. The present bipolar thin-film device is particularly useful as a phototransistor, though use is not limited only for this. A non-transparent, insulating layer having an opening may be provided to limit the passage of light and to improve the transistor characteristics.

9 Claims, 2 Drawing Sheets

THIN-FILM DEVICE

This is a continuation of application Ser. No. 265,909, filed May 21, 1981, now abandoned.

BACKGROUND OF THE INVENTION

1. Field of the Invention

This invention relates to a thin-film device which comprises a thin-film deposited on a substrate by evaporation, sputtering, etc., to attain desired electrical characteristics, and, more in particular, to a thin-film bipolar device which may be constructed by deposition of thin-films in a desired pattern by a variety of chemical, mechanical, or high-vacuum evaporation techniques with ease.

2. Description of the Prior Art

It has been common practice to employ the thin-film technology to mainly construct passive elements such as resistors and capacitors, or interconnections. And, as the state of technology, when one mentions a thin-film circuit, it generally means the circuit in which the passive elements and conductors are produced as films on a substrate. If it is required to provide active elements such as diodes and transistors as well, discrete or monolithic semiconductor devices must be combined with the thin-film devices to form a hybrid circuit.

Semiconductor devices have been widely used and they are increasingly used even now. One of the advantages of the semiconductor devices is that they may be formed on a small-sized single-crystal chip of silicon. Thus, the semiconductor technology is particularly useful in constructing a high density device such as an integrated circuit device, containing both active and passive elements and their interconnections. It should be noted, however, that since there is a maximum size limit for the silicon wafer, disadvantages are sometimes brought about due to incapability of direct applications. This is particulary true for an optical reader including an array of photoconductive elements required to scan the substantial length of an original.

For such an application to an optical reader, bipolar devices are required rather than MOS devices. For example, a phototransistor may be used as a reading element of the array. Such a phototransistor is a bipolar transistor which includes emitter, base and collector regions with two P-N junctions at the boundaries between the respective adjacent regions. It is true that bipolar transistors having a PNP or NPN structure may be manufactured on a single-crystal chip of silicon or germanium in accordance with the wellknown semiconductor device manufacturing technology. However, these single-crystal bipolar transistors require very fine and carefully conditioned processing which tends to increase the manufacturing cost and to lower the yield. Moreover, since there is a maximum size limit for this type of bipolar transistors, an unacceptably large number must be provided, or, alternatively, an additional interfacing circuit must be provided in certain applications which involve a relatively large area or a sizable length. If many transistors of this type were to be disposed along a line, then it would bring about the problem of non-uniform characteristics one from another.

SUMMARY OF THE INVENTION

This invention overcomes the shortcomings of the prior art devices and provides a thin-film device which may be manufactured with ease and may be advantageously used even if a relatively large area or a sizable length is involved. Preferably, a thin-film device of the present invention is in the form of a bipolar transistor including emitter, base and collector regions. Each of these regions may preferably correspond to each of the thin-films deposited one on another on a substrate.

In accordance with one embodiment of the present invention, either of the emitter or collector region is formed by CdS or a semiconductor material containing CdS and the other region is formed by CdTe or a semiconductor material containing CdTe with the base region formed by CdTe or a semiconductor material containing CdTe. On the other hand, in accordance with another embodiment of the present invention, either of the emitter or collector region is formed by CdS or a semiconductor material containing CdS and the other region is formed by selecting at least one material from the group consisting of Al, In, Ga, Cd and TE with the base region formed by CdTe or a semiconductor material containing CdTe. A bipolar thin-film transistor of the present invention may have either an NPN or PNP structure as desired.

It will be easily understood that bipolar thin-film transistors of the present invention may be advantageously applied, for example, to an optical reader as photoconductive elements for converting light signals to electrical signals. In such a case, these elements sometimes require to be designed in a particular shape, and they must have uniform characteristics. Since any thin-film manufacturing technique may be used to manufacture the present device, there are virtually no restrictions in designing a shape and the transistors may be manufactured substantially at low cost. Moreover, a method of batch processing may be employed to insure uniform characteristics as well as improved yield rate.

Therefore, it is an object of the present invention to provide an improved thin-film device which may be manufactured with ease and excellent repeatability as well as substantially at low cost.

Another object of the present invention is to provide a bipolar thin-film transistor which is stable and reliable in performance and of high sensitivity.

A further object of the present invention is to provide a bipolar thin-film transistor which has a high degree of freedom in designing its shape.

A still further object of the present invention is to provide a thin-film transistor which is particularly useful as a phototransistor.

Other objects, advantages and novel features of the present invention will become apparent from the following detailed description of the invention when considered in conjunction with the accompanying drawings.

DESCRIPTION OF THE PREFERRED EMBODIMENTS

In the following description, reference will be had with respect to a thin-film phototransistor of the NPN type without a base electrode embodying the present invention. However, it should be understood that the present invention is neither limited to the NPN type nor the phototransistor.

Figure 1:
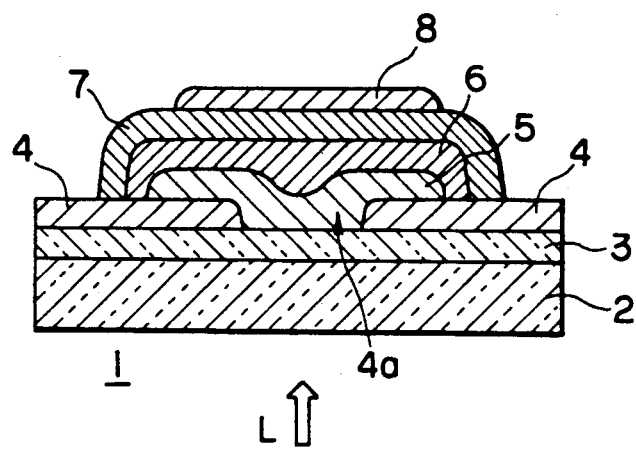
FIG. 1 is a cross-sectional view of a bipolar thin-film transistor embodying the present invention.

First, explanation will be had as to a general structure of a phototransistor 1 in accordance with the present invention with reference to FIG. 1. The phototransistor 1 includes a transparent substrate 2 on which is formed a transparent conductive layer 3. An insulating layer 4 with an opening 4a is formed on the layer 3. The layer 4 is not transparent to light so that the opening 4a forms a window to the incident light L. A first thin-film 5 of the N type conductivity is formed on the layer 3 partly extending over the layer 4 to completely cover the window 4a. A second thin-film 6 of the P type conductivity is formed on the film 5 in such a manner to extend to the insulating layer 4 thereby completely enclosing the film 5; a third thin-film 7 of the N type conductivity is formed on the film 6 to extend to the insulating layer 4 thereby completely enclosing the film 6. On top of the third film 7 is formed a conductive layer 8.

Therefore, there is provided a bipolar thin-film phototransistor 1 with the film 5 as an emitter region, the film 6 as a base region, and the film 7 as a collector region. There exist two PN junctions, each formed at the boundary between the two adjacent films. The conductive layer 3 is an emitter electrode; whereas, the top conductive layer 8 is a collector electrode.

In the case of a NPN type transistor, whether it is a phototransistor or not, it is preferable to have a structure as shown in FIG. 1 in which the emitter region 5 is completely covered by the base region 6 which, in turn, is completely covered by the collector region 7. As such, the surface area of each film increases from the emitter electrode 3 to the collector electrode 8. A main reason for this is that electrons play a dominant role in the NPN type transistor.

In accordance with one embodiment of the present invention, the transparent conductive layer 3 is formed on the transparent substrate 2 by spraying sputtering, evaporation, or the like. The layer 3 may be made of a material such as $In_2O_3$, $SnO_2$ and oxides of In-Sn. A material for the substrate 2 includes soda glass, quartz glass, boron-silicon glass and plastics, but it is to be noted that selection may be made from a wide variety of materials which allow transmission of light.

Then, the insulating layer 4 such as $SiO_2$ is formed on the conductive layer 3 for example by the CVD method, and, thereafter, a part of the thus formed layer 4 is etched away to define the window 4a. Then, on the conductive layer 3 and partly on the insulating layer 4 as well is formed the thin-film 5 of CdS or a semiconductor material containing CdS with the thickness of 0.5–10 $\mu$m, preferably 1–5 $\mu$m, by sputtering/evaporation. Here, the semiconductor material containing CdS implies a material which contains CdS and group VII elements such as Cl, Br and I or group III elements such as Al, Ga and In as impurities, and the film 5 in this case exhibits the N conductivity type. It is preferable to subject the thus formed film 5 to heat treatment in the oxygen containing atmosphere, which may be air. As a result, the film 5 is improved in electrical characteristics as well as mechanical characteristics.

Then, the film 6, which defines a base region, is formed by depositing CdTe or a semiconductor material containing CdTe on the film 5 to the thickness below 5 $\mu$m, preferably 1–3 $\mu$m, by sputtering or evaporation. Here, the material containing CdTe implies a material which contains CdTe and impurities such as Li, Sb, P, Au, Ag, Cu and Pb so that the film 6 exhibits the P type conductivity.

The film 7, which defines a collector region, is then formed on the film 6 with CdTe or a semiconductor material containing CdTe by sputtering or evaporation. The material containing CdTe for forming the film 7 implies a material which contains CdTe and group VII elements such as Br and I or group III elements such as Al, Ga and In as impurities, thereby the film 7 exhibits the N type conductivity.

Finally, the conductive layer 8 is formed by depositing a conductive material such as Au and Ni on the film 7 by sputtering or evaporation.

In accordance with another embodiment of the present invention, the above description for the first embodiment is equally applicable except that part of the description which is concerned with the film 7, defining a collector region. That is, this embodiment proposes to form the film 7 by depositing a material selected at least one from the group consisting of Al, In, Ga, Cd and Te to thickness of 1,000 Å–3 $\mu$m by sputtering or evaporation. It is preferable to use Te. In this instance, it should be understood that the film 7 exhibits the N type conductivity.

Figure 2:
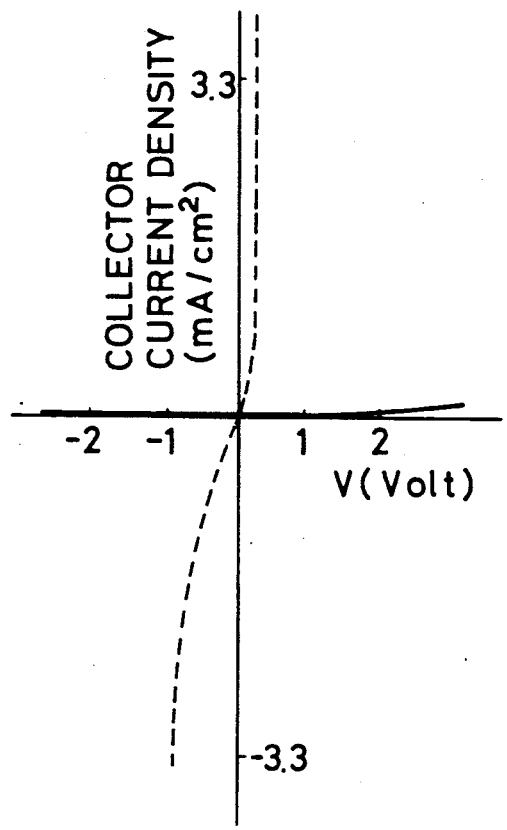
FIG. 2 is a graph illustrating the collector current density as a function of an applied voltage for the device shown in FIG. 1.
Figure 3:
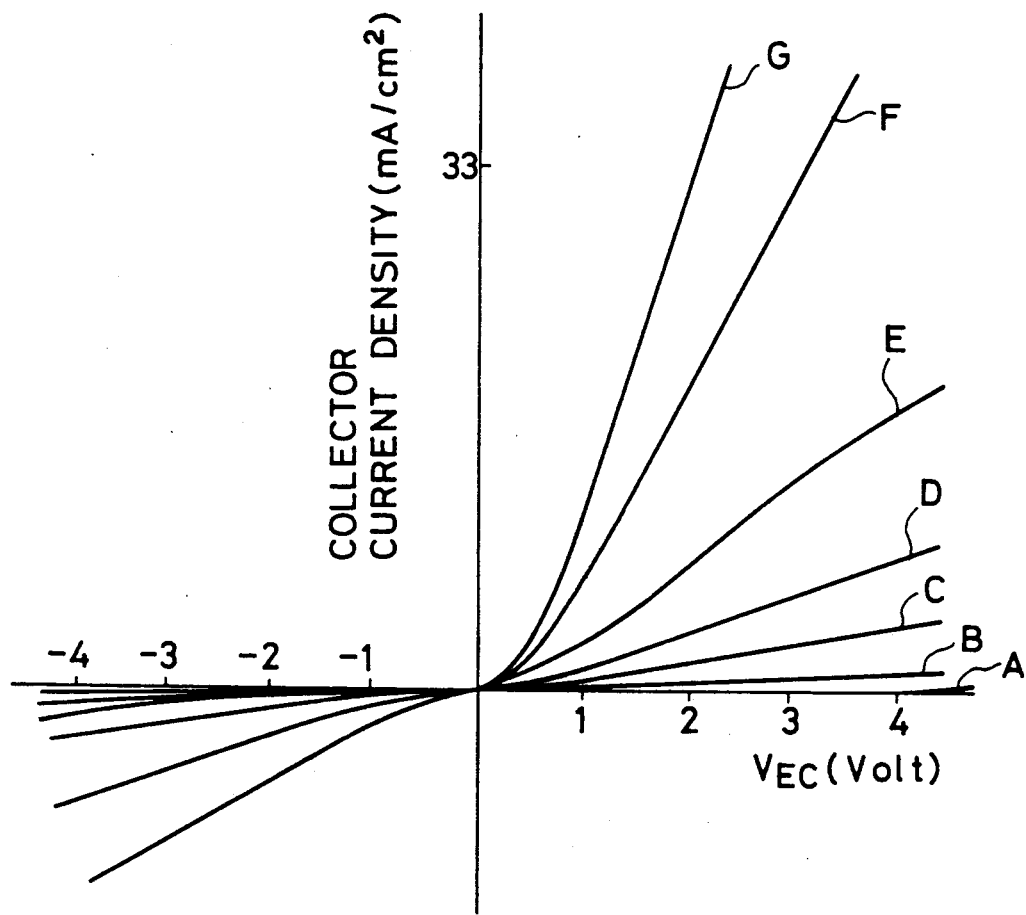
FIG. 3 is a graph illustrating the collector current density as a function of the emitter-collector voltage for the device shown in FIG. 1 with the illumination as a parameter.

Now, explanation will be had with respect to representative photo-electric characteristics for a typical device shown in FIG. 1 in accordance with the present invention. FIG. 2 illustrates the photo-electric characteristics of a NPN type phototransistor embodying the present invention; whereas, FIG. 3 illustrates the relationship between the collector current density and the emitter-collector voltage for such a phototransistor. The phototransistor tested had the emitter surface area of 3 $mm^2$.

Referring to FIG. 2, the dotted line indicates the relationship between the current density and the applied voltage V under the illumination of 100 luxes; the solid line indicates the similar relationship without illumination. On the other hand, as shown in FIG. 3, the line A indicates the relationship between the collector current density and the emitter-collector voltage $V_{EC}$ without illumination; whereas, the lines B, C, D, E, F and G indicate the similar relationships under the illumination of 1, 5, 10, 20, 50 and 100 luxes, respectively.

As is shown in FIGS. 2 and 3, when the emitter-collector voltage $V_{EC}$ is set at 0.4V, the current density without illumination is about 1.8 $\mu A/cm^2$; whereas, the current density with illumination is about 3.6 $mA/cm^2$ which is $2 \times 10^3$ times larger than that without illumination. It should now be understood that the present phototransistor has an excellent photosensitivity. It should be noted that the collector current density varies sensitively as the illumination changes.

Although the above detailed description is only concerned with the case in which a thin-film device of the present invention has a structure of the NPN type photo-transistor, it should be understood that the present invention should not be limited to that application, but it is equally applicable to the PNP type phototransistor by selecting appropriate impurities to be contained in each of the thin-films. Moreover, it is also possible to use the present thin-film device as an ordinary bipolar transistor in a discrete or integrated form with the provision of a base electrode. In this instance, the substrate is not required to be transparent and a material for forming the electrodes may be selected from a wider variety as long as it can form an ohmic contact with CdS.

From the above description, it can be appreciated that the present device has a high degree of freedom in designing the shape since emitter, base and collector regions may be defined by forming three thin-films superposed one on another. Furthermore, any of the well-known thin-film forming techniques such as sputtering and evaporation may be employed as desired, which contributes to lower the manufacturing cost. Besides, when the present device is used as a phototransistor, there are additional advantages such as minimum leakage current and enhanced current under illumination.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A thin film bipolar transistor device comprising:
   a substrate;
   a first conductive layer formed on said substrate;
   an insulating layer formed on said first conductive layer and provided with a window;
   a first deposited thin-film which is of a first conductivity type and is formed by deposition on said conductive layer and partly extends over said insulating layer and completely covers said window;
   a second deposited thin-film which is of a second conductivity type opposite to said first conductivity type and is formed by deposition on said first thin-film and extends to said insulating layer to thereby enclose said first thin-film;
   a third deposited thin-film which is of said first conductivity type and is formed by deposition on said second thin film and extends to said insulating layer to thereby enclose said second thin-film; and
   a second conductive layer formed on said third thin-film.

2. A device as in claim 1 wherein one of said first and third deposited thin-films is made of CdS or a semiconductor material containing CdS while each of: (i) the other of said first and third deposited thin-films thin-film; and (ii) the second deposited thin-film, is made of CdTe or a semiconductor material containing CdTe.

3. A device as in claim 2 wherein the conductivity of each of said first and third deposited thin-films is N-type while the conductivity of said second deposited thin-film is P-type.

4. A device as in claim 2 wherein the conductivity of each of said first and third deposited thin-films is P-type while the conductivity of said second deposited thin-film is N-type.

5. A device as in claim 1 wherein one of said first and third deposited thin-films is made of Cds or a semiconductor material containing Cds while the other of said first and third deposited thin-films is made of a material selected from the group consisting of Al, In, Ga, Cd and Te, and wherein said second deposited thin-film is made of CdTe or a semiconductor material containing CdTe.

6. A device as in claim 5 wherein the conductivity of each of said first and third deposited thin-films is N-type while the conductivity of said second deposited thin-film is P-type.

7. A device as in claim 5 wherein the conductivity of each of said first and third deposited thin-films is P-type while the conductivity of said second deposited thin-film is N-type.

8. A device as in claim 1 wherein said substrate and first conductive layer are both transparent and said insulating layer is non-transparent to thereby allow the passage of light only through said window.

9. A device as in claim 1 wherein said first deposited thin-film is 0.5–10 $\mu$m thick, said second deposited thin-film is less than 5 $\mu$m thick, and said third deposited thin-film is 1000 A–3 $\mu$m thick.

* * * * *